(12) United States Patent
Campardo et al.

(10) Patent No.: US 6,515,911 B2
(45) Date of Patent: Feb. 4, 2003

(54) CIRCUIT STRUCTURE FOR PROVIDING A HIERARCHICAL DECODING IN SEMICONDUCTOR MEMORY DEVICES

(75) Inventors: Giovanni Campardo, Bergamo (IT); Rino Micheloni, Turate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/894,975

(22) Filed: Jun. 27, 2001

(65) Prior Publication Data

US 2002/0021584 A1 Feb. 21, 2002

Related U.S. Application Data

(63) Continuation of application No. 09/408,157, filed on Sep. 29, 1999, now abandoned.

(30) Foreign Application Priority Data

Sep. 30, 1998 (EP) .............................................. 98830570

(51) Int. Cl.[7] .............................................. G11C 16/06
(52) U.S. Cl. ............................ 365/185.23; 365/185.13; 365/230.06
(58) Field of Search ....................... 365/185.11, 185.13, 365/185.23, 230.03, 230.06

(56) References Cited

U.S. PATENT DOCUMENTS

| | | | | |
|---|---|---|---|---|
| 5,282,175 A | | 1/1994 | Fujita et al. | ............ 365/230.06 |
| 5,506,816 A | | 4/1996 | Hirose et al. | ........... 365/230.06 |
| 5,513,146 A | | 4/1996 | Atsumi et al. | .......... 365/185.35 |
| 5,761,135 A | * | 6/1998 | Lee | ......................... 365/230.06 |
| 5,880,995 A | | 3/1999 | Kobatake | ................ 365/185.23 |
| 5,940,343 A | * | 8/1999 | Cha et al. | ............... 365/230.03 |
| 5,973,963 A | | 10/1999 | Sugawara | ............... 365/185.23 |

FOREIGN PATENT DOCUMENTS

EP 0 822 660 A1 2/1998

OTHER PUBLICATIONS

Takeshima, T. et al., "A 3.3 V Single–Power–Supply 64Mb Flash Memory with Dynamic Bit–Line Latch (DBL) Programming Scheme," *IEEE International Solid State Circuits*, vol. 37, Feb. 1994, pp. 148–149 and 327.

Umezaa, A. et al., "A 5–V–Only Operation 0.6–μ.m Flash EEPROM with Row Decoder Scheme in Triple–Well Structure" *IEEE Journal of Solid–State Circuits*, vol. 27, No. 11, Nov. 1992, pp. 1540–1546.

* cited by examiner

*Primary Examiner*—Richard Elms
*Assistant Examiner*—Vanthu Nguyen
(74) *Attorney, Agent, or Firm*—Lisa K. Jorgenson; Robert Iannucci; Seed IP Law Group PLLC (57) ABSTRACT

A circuit device structured to enable a hierarchic form of row decoding in semiconductor memory devices of the non-volatile type and including a matrix of memory cells with sectors organized into columns, wherein each sector has a group of local word lines individually connected to a main word line running through all of the matrix sectors which have rows in common is presented. The device includes a PMOS first transistor having conduction terminals connected respectively to the main word line and the local word line, an NMOS second transistor having conduction terminals connected respectively to the local word line and the main word line, and a PMOS third transistor having conduction terminals connected respectively to the main word line and the local word line. Such a third transistor is a charge transistor that reduces the charging time for the local word line.

19 Claims, 10 Drawing Sheets

CIRCUIT STRUCTURE FOR PROVIDING A HIERARCHICAL DECODING IN SEMICONDUCTOR MEMORY DEVICES

This application is a continuation of U.S. patent application Ser. No. 09/408,157, filed Sep. 29, 1999, now abandoned.

FIELD OF THE INVENTION

This invention relates to a circuit device for carrying out a hierarchic form of row decoding in semiconductor memory devices, and more particularly to a device which comprises at least one matrix of memory cells having sectors organized into colunmns, wherein each sector has a specific group of local word lines individually connected to a main word line running through all of the matrix sectors which have rows in common.

DESCRIPTION OF THE INVENTION

As is well known, a memory matrix architecture most widely utilized in the construction of semiconductor integrated, non-volatile memory devices is the NOR type.

Figure 1:
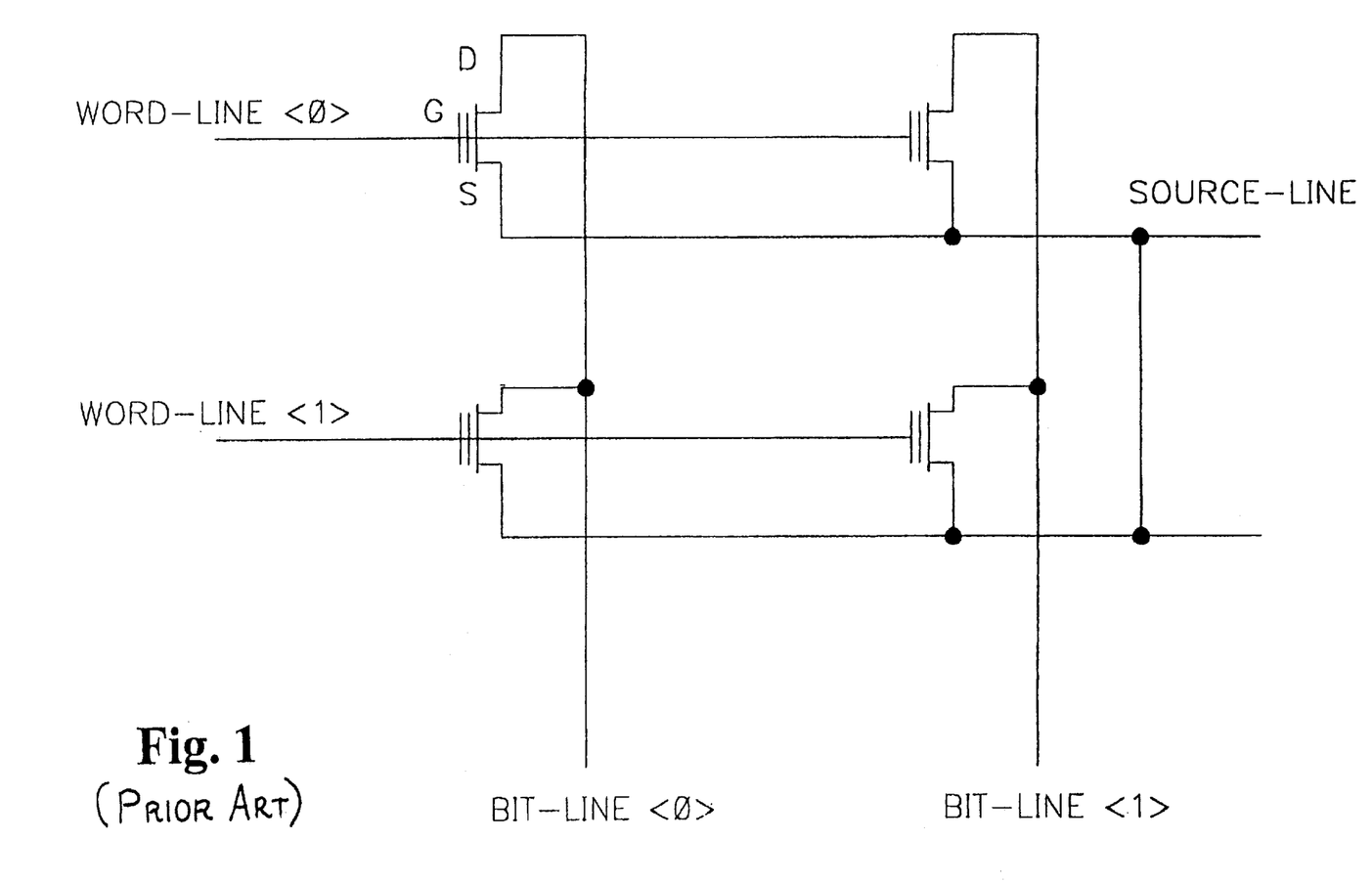
FIG. 1 is a schematic view of a portion of a conventional memory matrix of the NOR type.

In this type of architecture, memory cells belonging to one matrix row have their gate terminals in common, while memory cells belonging to one matrix column have their drain terminals in common. The source terminals are, on the other hand, shared by all the cells of one matrix sector. A portion of a NOR matrix is shown in FIG. 1 by way of example.

To specify a given memory location, it is sufficient to identify a given row and given column: one memory cell is to be found at their intersection.

Figure 2:
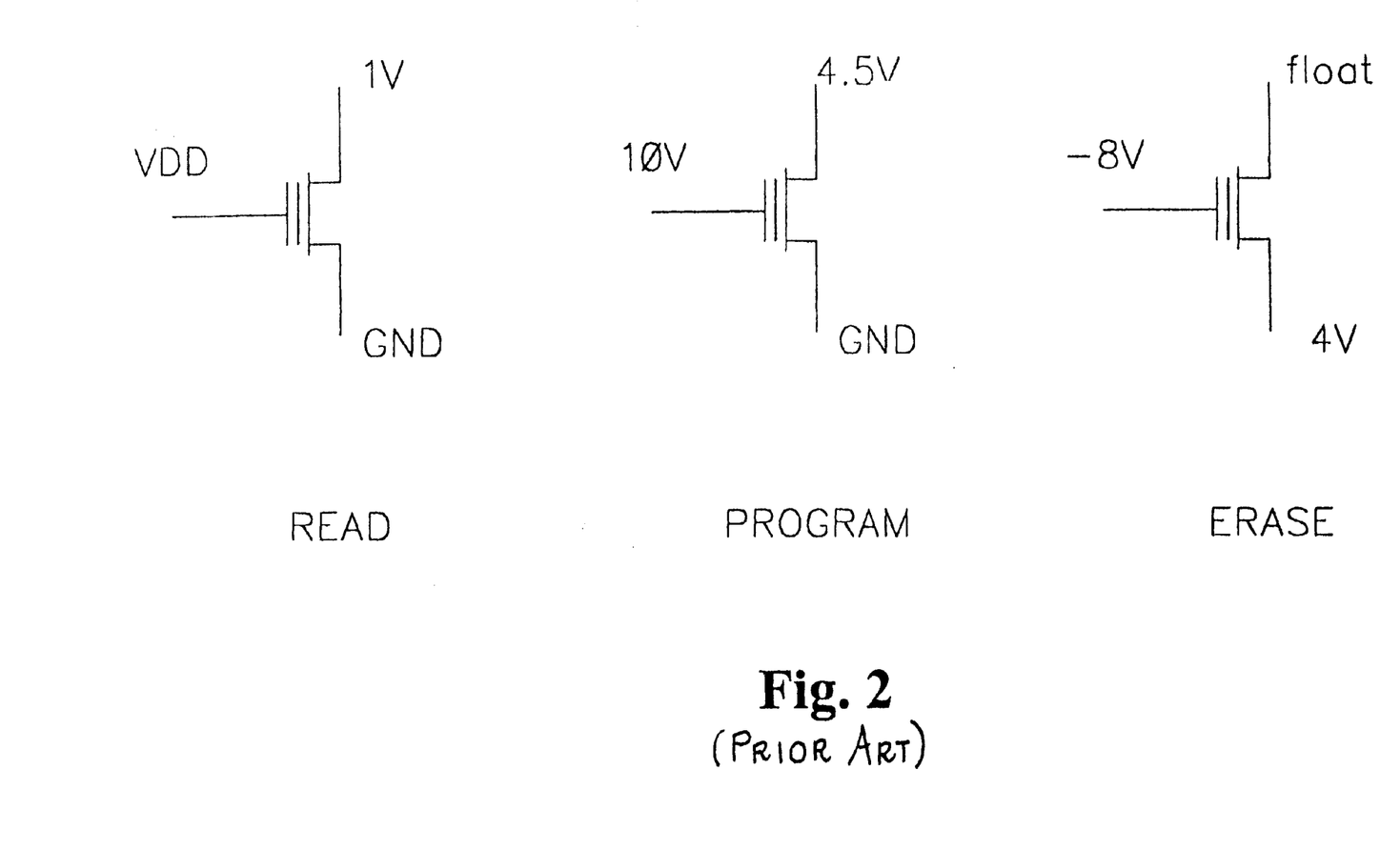
FIG. 2 shows memory cells and typical associated bias voltage values to be applied to the cell terminals during the read, write and erase phases thereof, respectively.

As is known, in non-volatile memories, a memory cell comprises a floating-gate transistor which also has drain and source conduction terminals. Shown in FIG. 2 are examplary values of bias voltages to be applied to the terminals of a memory cell during read, write and erase operations, respectively.

A pre-requisite of non-volatile memories of the Flash EEPROM type is that the information stored therein should be erased as groups or packages of bits. The erase operation is the single operation that involves biasing of the source terminal, and since all the cells have this terminal in common, they can be written into and read from in an independent manner but must be erased simultaneously.

Particularly with Flash memories, the erase operation is performed by sectors, in the sense that all the cells that run to the same source line must be erased simultaneously.

Within a non-volatile memory matrix, the sectors can be organized either into rows or columns. In a row type of organization, the size of a sector is given by the number of rows that it contains. The architecture of the storage device is designed to suit the number and size of the sectors in order to optimize the circuit area consumption, as well as the device performance and reliability.

Since a single bit line to be shared by all of the matrix sectors would be impossible to provide due to a problem known as "drain stress", each sector is arranged to include a specific group of columns referred to as the "local bit lines". Local bit lines are individually connected, via a pass transistor, to a main metallization connection referred to as the "main bit line". Each sector is assigned a local group of pass transistors which are only turned on in the addressed sector, so that the cells of the other matrix sectors need not be affected by drain stress.

Figure 3:
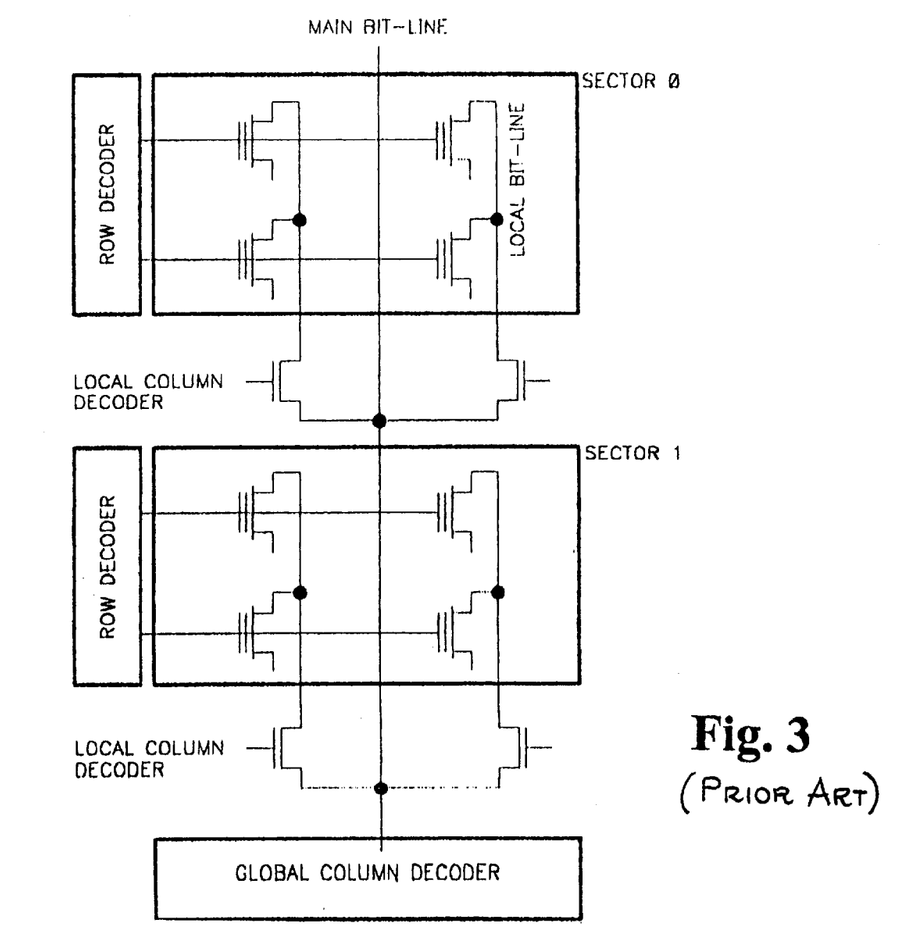
FIG. 3 is a schematic view of a conventional architecture for a non-volatile memory matrix having sectors arranged in row form.

Shown schematically in FIG. 3 is a conventional architecture for a non-volatile memory matrix wherein the sectors are organized into rows. Also shown therein are the various row decoders associated with each sector.

Such an architecture islarge in circuit space requirements because it entails the provision of a decoder for each sector, and of local column decoders to avoid the drain stress phenomenon.

Furthermore, it should be noted that the rows of the memory matrix are physically in the form of polysilicon strips interconnecting all the gate terminals of the cells in one row.

From an electrical standpoint, each polysilicon strip may be viewed as a distributed RC network. For example, even when a relatively small number of cells such as 1024 is assumed, the time constant associate with one row in the matrix and defined by the RC network would be approximately 10 nsec. This value represents the time interval to be allowed for an electric signal to go through a matrix row, and it affects the memory access time directly which, as can be appreciated, should be kept as short as possible.

Due to the high cell integration density in the integrated storage circuit, the local bit lines and main bit line are formed by a process which results in two different metallization layers or levels being deposited, and unless a third metallization level is provided, the polysilicon row cannot be short-circuited and the row charging time be reduced.

Figure 4:
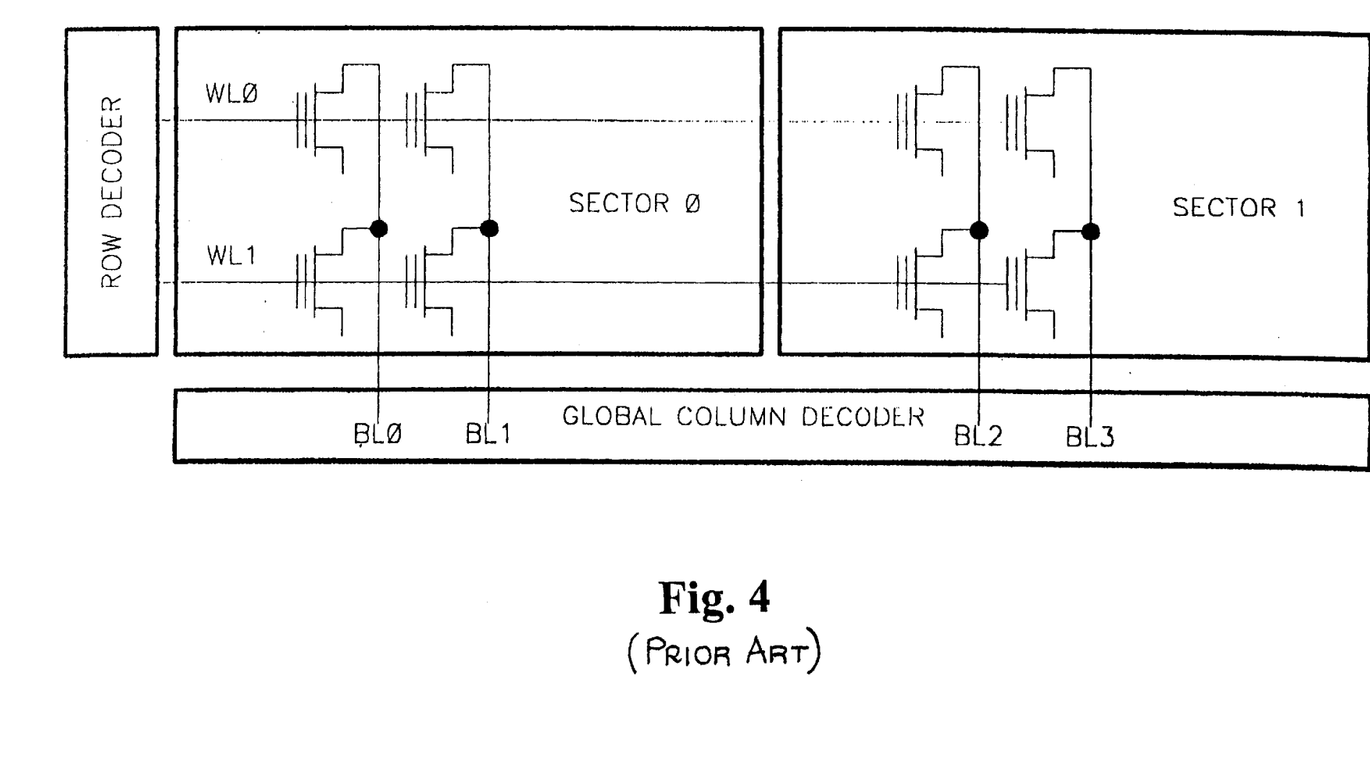
FIG. 4 is a schematic view of a portion of a conventional memory matrix having sectors arranged in column form.

Another prior technical solution provides non-volatile memory matrices which are organized into columns. In this case, the matrix rows are shared in common by all sectors, and the sector size is determined by the number of columns. FIG. 4 is a schematic view of a portion of a memory matrix organized into columns.

With this type of architecture, the parasitic capacitance of each bit line can be kept quite low, which is beneficial to the circuit portion involved in reading the memory contents. In addition, row decoding will be shared by several matrix sectors, which affords savings in circuit space.

Where a matrix is fabricated by a technological process providing two metallization levels, one level is used for forming the bit lines, and the other level is used for short-circuiting the row in order to reduce its parasitic resistance during the charging phase.

While being advantageous in several ways, the last-mentioned architecture has a drawback in that, each time that a cell is addressed, all the cells in the same row also become biased and affected by the so-called "gate stress".

Consistently with a current trend in Flash storage devices provided with a single supply voltage, the erasing phase is performed by sectors, with the gate terminals of the cells being biased with negative voltages. The negative gate erase mode used for matrices having sectors organized into columns results in an unacceptable amount of gate stress for the memory device.

SUMMARY OF THE INVENTION

Embodiments of this invention provide a circuit device which allows negative voltage erasing in memory matrices that are organized into columns, thereby overcoming the limitations and drawbacks of prior art solutions for non-volatile memory devices having a single-voltage supply.

One of the principles on which embodiments of the present invention stand is one of performing a row decoding phase of the hierarchic type by means of an additional transistor having conduction terminals connected, one to the local word line and the other to a ground reference voltage.

In one embodiment, a circuit device is provided capable of carrying out a hierarchic form of row decoding for semiconductor memory devices of the non-volatile type comprising at least one matrix of memory cells with sectors organized into columns, where each sector has a specific group of local word lines individually connected to a main word line running through all of the matrix sectors which have rows in common. The device includes a first transistor having conduction terminals connected between the main word line and the local word line, and a second transistor having its conduction terminals connected between the local word line and a reference voltage.

DETAILED DESCRIPTION

Figure 5:
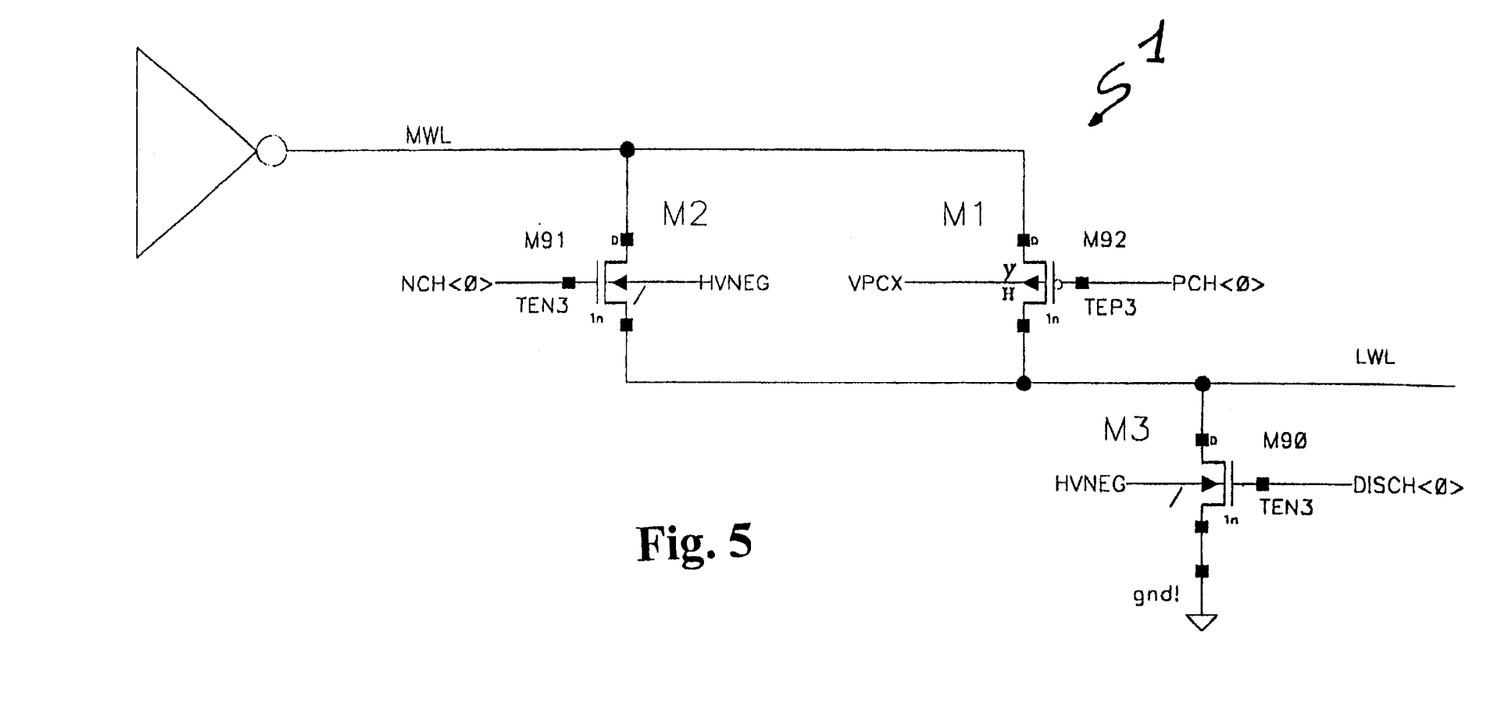
FIG. 5 is a schematic view of a first embodiment of a device for carrying out a hierarchic row decoding.

Referring to FIG. 5, generally and schematically shown at 1 is a circuit device that allows sectors of a non-volatile memory matrix to be erased by a negative voltage. The matrix may comprise memory cells of the Flash EEPROM type, for example.

Depicted schematically is a portion of a memory matrix 2 (FIG. 6) which includes first 3 and second 4 sectors. Each of the two sectors 3 and 4 is shown schematically with just a few, designated 5, of the thousands of memory cells that would be incorporated to the actual sectors.

Figure 6:
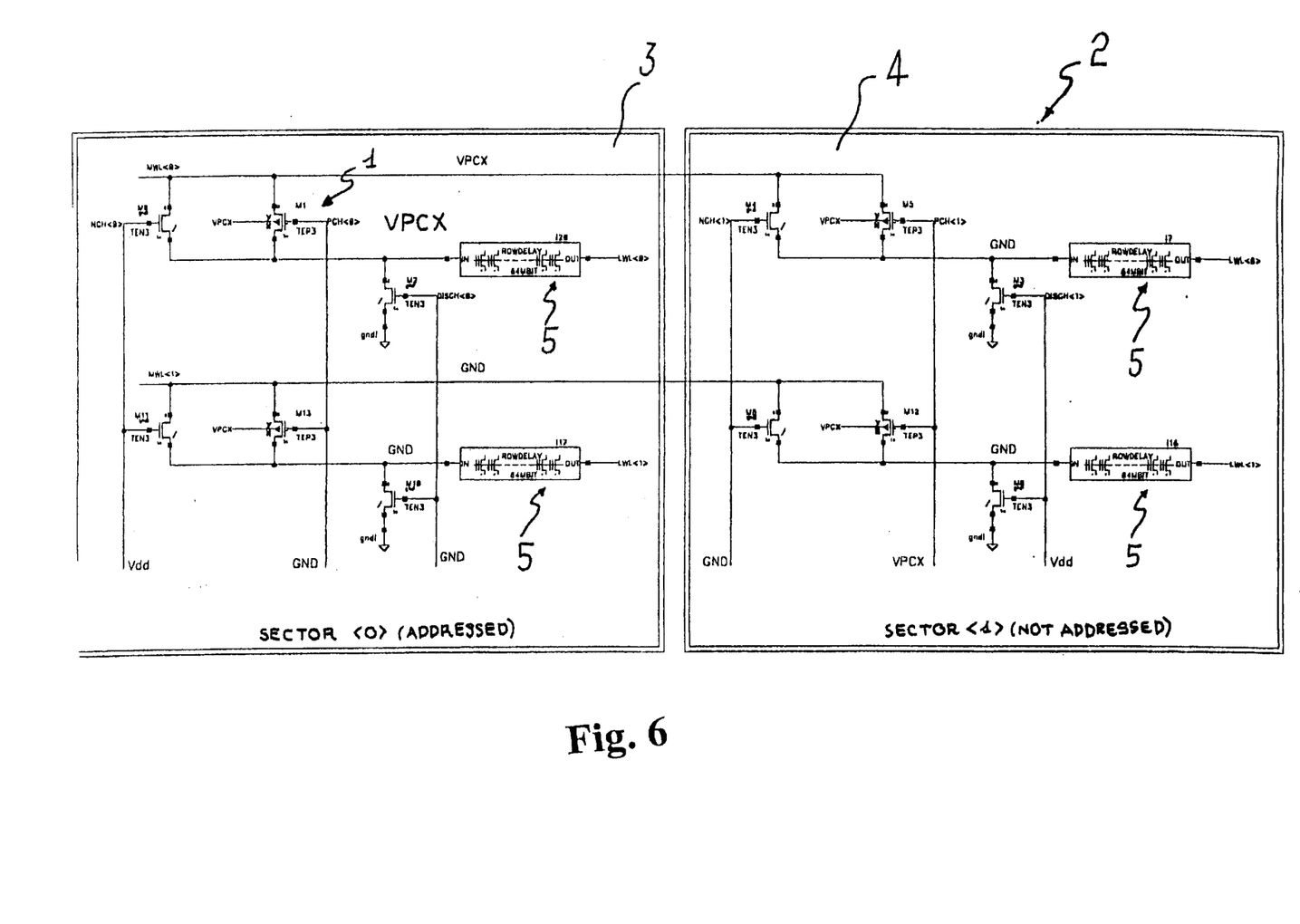
FIG. 6 is a schematic view of a portion of a memory matrix, organized into columns and incorporating decoding devices.

The cells 5 are arranged as a plurality of local word lines or rows denoted by the acronym LWL (Local Word Line). The first row is designated LWL<0>, the second row LWL<1>, and so on.

Provided parallel with each matrix row is a main word line or row, referenced MWL (Main Word Line), running through all those sectors which have rows in common, such as the sectors 3 and 4.

Advantageously, in some embodiments of this invention, the circuit device is connected, within each sector, upstream of each local row LWL of the memory matrix.

The memory device is supplied by a single supply voltage Vdd having a value in the 2.5 to 3.6 volts range, and is also connected to a second voltage reference GND, such as a signal ground.

The device 1 comprises a first transistor M1, of the PMOS type, which has its conduction terminals connected, one to the main word line MWL and the other to the local word line LWL.

The body terminal of the transistor M1 receives a bias signal VPCX, and its gate terminal receives a signal PCH.

The gate terminals of all the transistors M1 of the devices 1 associated with the matrix rows of one sector 3 or 4 are all connected together and receive the same voltage signal.

The device 1 further comprises a second transistor M2, of the NMOS type, which also has its conduction terminals connected, one to the main word line MWL and the other to the local word line LWL.

The body terminal of the transistor M2 receives a negative voltage (approximately −8V) bias signal HVNEG during the erase phase, and its gate terminal receives a signal NCH. The voltage value of HVNEG will be 0V (i.e., GND) throughout the other operating phases.

The gate terminals of all the transistors M2 of the devices 1 associated with the matrix rows of one sector 3 or 4 are all connected together and receive the same voltage signal.

A transistor M3 of the NMOS type is advantageously connected with its conduction terminals between the local word line LWL and the ground reference GND.

The body terminal of the transistor M3 receives a bias signal HVNEG at a negative or zero voltage, and its gate terminal receives a signal DISCH.

The gate terminals of all the transistors M3 of the devices 1 which are associated with the matrix rows of one sector, 3 or 4, are all connected together and receive the same voltage signal.

Advantageously, moreover, the NMOS transistors M2 and M3 are formed using a triple-well technology, as explained herein below.

The operation of the device 1 according to an embodiment of the invention will now be discussed, where the word line is biased to the voltage value of VPCX.

The voltage VPCX is the row decode supply voltage; it will be Vdd during the read phase and a voltage Vpp of about 10V during the program phase.

The voltage VPCX can be higher than the supply voltage Vdd, when the read operation requires a boosted voltage for the word line.

The voltage HVNEG is at the ground value GND at all times other than during the erase phase, when it takes a negative value (−8V).

1) A first case of MWL=VPCX and LWL=VPCX will be analysed:

This is within the addressed sector. The gate terminal of the transistor M1 receives a signal PCH at the ground value GND, and the transistor M1 ensures full transfer of the positive voltages, from the main word line MWL to the local word line LWL.

The body terminal of the transistor M1 is at the highest of the available potentials, i.e. at the value of VPCX.

The transistor M3 is in the off state, to avoid coupling the local word line LWL to ground.

The presence of the transistor M2 is largely uninfluential, since: if on, it would assist in charging the local word line LWL up to a voltage equal to its gate-threshold voltage; if off, its contribution would be nil.

Thus, by turning on the transistor M2, the effectiveness of the local word line LWL charging phase is enhanced.

2) A second case of MWL=VPCX and LWL=GND will be analysed:

This is outside the addressed sector. The transistor M1 should be in the off state, and accordingly, the signal PCH brought to the value of VPCX. The transistor M2 also should be in the off state, so as not to drain charge away from the main word line MWL.

Consequently, the third transistor should be on, to bond the line LWL to ground. It will be sufficient, for the purpose, that the signal DISCH be biased to Vdd.

3) A third case of MWL=GND and LWL=GND will now be analysed: under these conditions, the state of the transistor M1 is uninfluential because this is a P-channel transistor, unable to transfer the ground potential unless its gate terminal is brought to a negative voltage value. Therefore, to bond the line MWL to ground, the transistors M2 and M3 can be acted upon to bias their gate terminals to Vdd.

The three operative conditions outlined herein above are summarized schematically in FIG. 6, where the necessary bias levels are shown, both within and without the addressed sector.

The gate terminal of the transistor M1 is driven by a logic signal PCH which is coupled to either the voltage levels GND or VPCX, depending on the desired state.

The gate terminals of the transistors M2 and M3 are driven by respective logic signals NCH and DISCH, coupled to either the voltage levels GND or Vdd, depending on the desired state.

It is interesting to observe that three control signals per sector will suffice.

Figure 7:
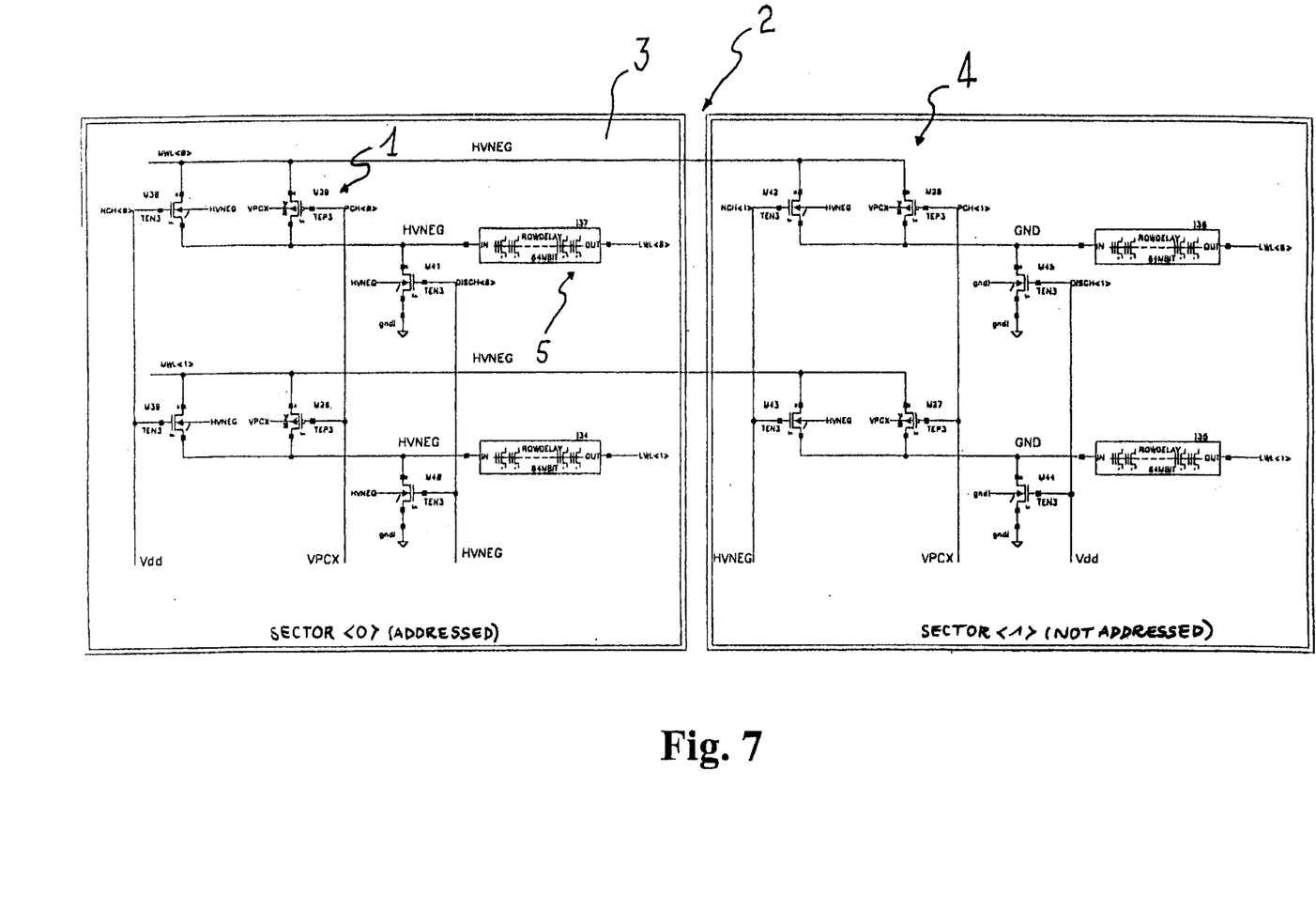
FIG. 7 is a schematic view of a portion of a memory matrix, organized into columns and incorporating decoding devices, shown during a matrix sector erase phase.

The erasing phase at a negative voltage will now be discussed. In this case, all of the word lines MWL are biased to a voltage HVNEG of −8V, as shown in FIG. 7.

A) The sector is being erased:
the state of the transistor M1 is uninfluential because the voltage to be passed on through the local word line LWL is negative. The gate terminal of the transistor M1 is, therefore, brought to the same value as the supply voltage Vdd. Concurrently therewith, the transistors M2 are turned on to admit negative voltage and bias the local word line LWL with the negative voltage HVNEG.

The transistor M3 is turned off to prevent charge from being transferred to the negative voltage source from the ground GND. This transistor M3 is turned off by biasing the signal DISCH of the sector being erased to the value HVNEG, as shown in FIG. 7.

B) The sector is not being erased:
the transistors M1 and M2 are in the off state because PCH=VPCX and NCH=HVNEG. The transistor M3, on the other hand, will be activated so as not to allow the local word lines LWL to float. For that purpose, the gate of the transistor M3 is delivered the signal DISCH=Vdd.

The local word lines LWL of the unaddressed sectors are all biased to ground potential.

For erasing, VPCX is generally equal to Vdd or some lower voltage, in order to minimize the stress on the final inverter of the row decoder.

Since the transistors M2 and M3 are seeing a negative voltage across them in the various conditions of operation, they are suitably formed using a triple-well technology.

FIG. 7 shows the various bias levels, both for the sector which is being erased and the other sectors which are undergoing no erasing procedure.

A major advantage of embodiments of the invention is a reduced number of control signals for managing all the operations in which a given sector is involved. The signals PCH, NCH and DISCH are shared by all local word lines of one sector.

The above scheme may be modified by omitting the transistor M2, whose single function is that of transferring the ground voltage level from the unselected main line MWL to the local line LWL.

In some embodiments, it is necessary to have the gate terminal of the transistor M1 biased below the ground value (by at least one P-channel threshold and associated body). It should be noted, however, that with single supply memories, no negative voltages will usually be available and these must be produced by specially provided circuitry.

Figure 8:
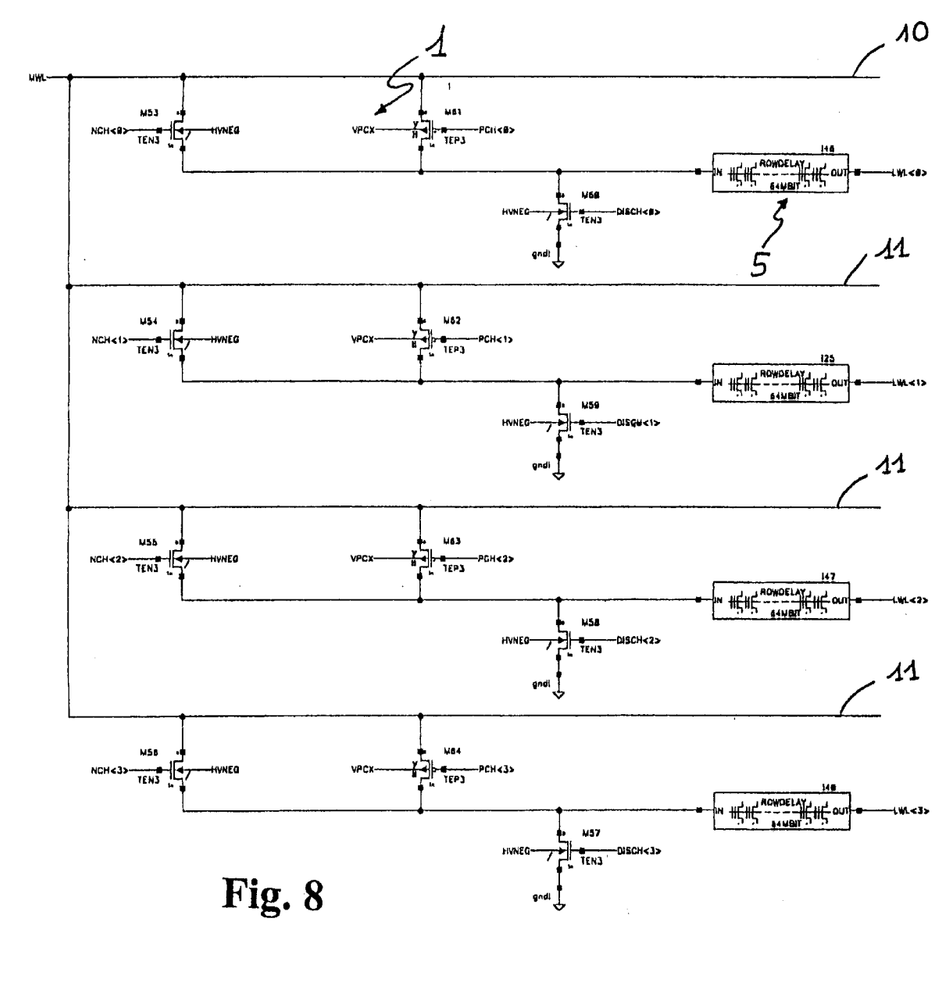
FIG. 8 is a schematic view of a portion of a memory matrix, organized into columns, according to another embodiment of the invention.

It can be appreciated from the foregoing that the device of this invention would also allow a hierarchic type of row decoding to be carried out. In this respect, FIG. 8 shows a modified embodiment of the invention.

In this modification, plural lines 11 branch off a single main word line MWL, referenced 10, and run parallel to the local word lines LWL. In this way, it is as if no main line MWL for each local line LWL were provided, so that a metallization connect at row pitch is no longer needed.

This solution is highly advantageous in terms of the main word line MWL charging time, since it decreases the value of the coupling parasitic capacitance between adjacent word-line metallizations. Concurrently therewith, the likelihood of short-circuits occurring between metallization lines is reduced, with evident benefits from the standpoint of production of the device on an industrial scale.

Finally, row decoding also benefits from it: in fact, it is no longer necessary for each decoding driver circuit of the main word line MWL, and its associated control circuitry, to be provided at word line pitch, but only at the pitch of two or more word lines. This reflects in space savings, and most notably in an ability to carry out row decoding of greater complexity than is conventional, or effective to lower power consumption for reading, for example.

The last-mentioned aspect is of primary importance to memories which utilize voltage-boosted word lines for reading.

In FIG. 8, a scheme is depicted for a four-level hierarchic row decoding, that is, wherein four local lines LWL correspond to each main line MWL.

This solution involves an increased number of control signals for each sector. In this case, there are four discrete signals, namely: four signals NCH<0>, NCH<1>, NCH<2>, NCH<3>, four signals PCH, and four signals DISCH.

The circuit design as proposed by this embodiment effectively reduces the word line charging time.

The main word line MWL is formed from a metallization layer, which makes its actual parasitic resistance trivial. But the value of the parasitic resistance is not negligible, and is due both to the coupling to underlying layers and the coupling to the metallizations of the main line MWL which run alongside it. However, the last-mentioned contribution can be greatly reduced by the hierarchic decoding structure of this invention.

Figure 9:
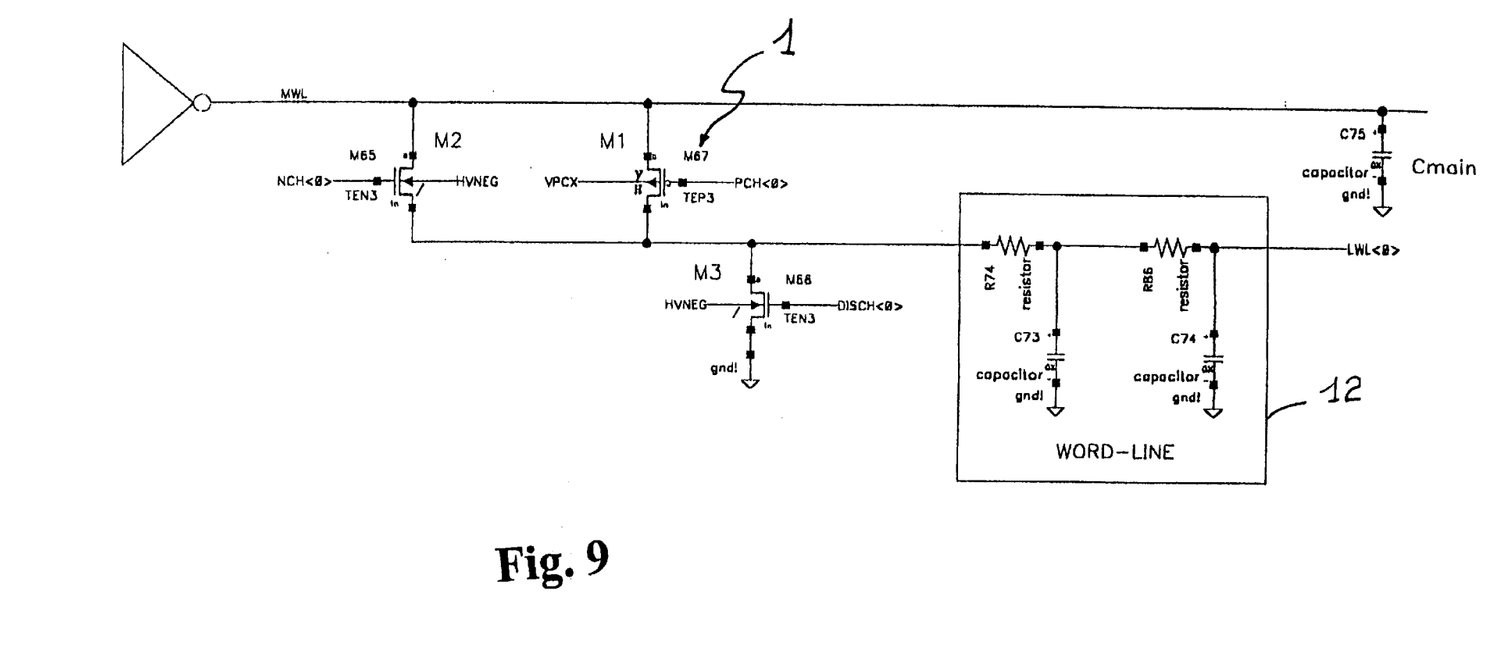
FIG. 9 is a schematic view of the circuit device shown in FIG. 5, showing components as well as resistive and capacitive loads thereof.

The local line LWL, on the other hand, is formed from a polysilicon layer, and from the standpoint of its parasitic components can be represented by a distributed RC network as illustrated by, for example, the block 12 in FIG. 9.

The usual approach to reducing the time constant associated with the word line charging is to short-circuit the polysilicon row to a metallization layer. By so doing, however, the metallizations must be designed at word line pitch, thereby increasing the parasitic capacitance, referenced Cmain in FIG. 9, and requiring enhanced lithographic definition of the metallization.

Figure 10:
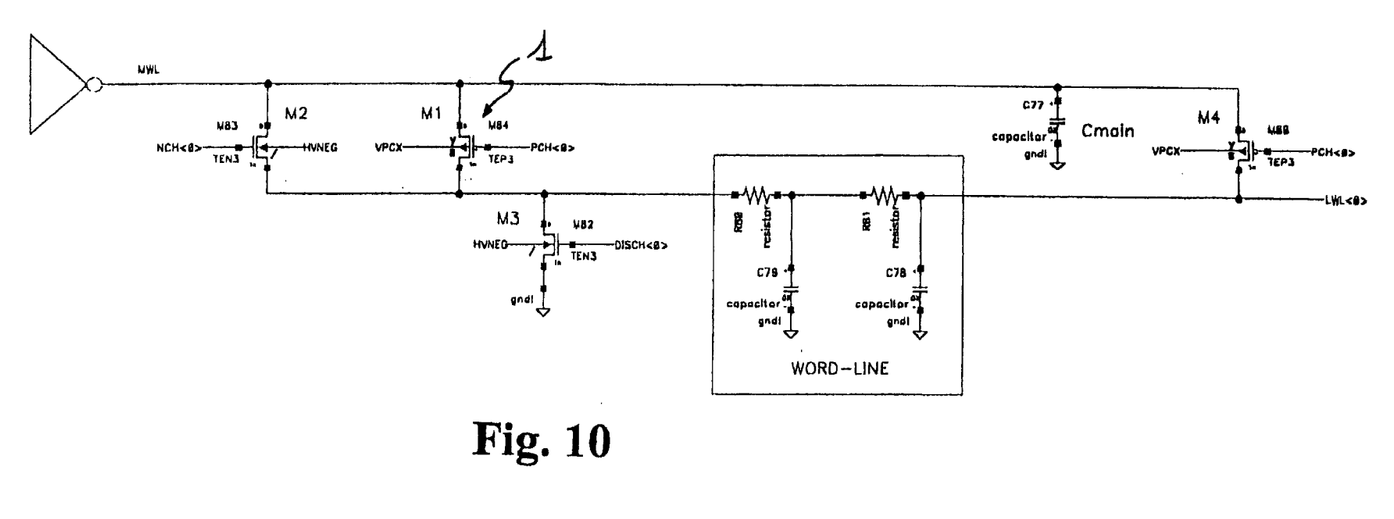
FIG. 10 is a schematic view of another embodiment of the device of FIG. 5.

With the described solutions, the charging problem is solved as shown in FIG. 10. In fact, a P-channel charge transistor M4 is provided which has its conduction terminals connected between the main word line MWL and the local word line LWL. The provision of this transistor is effective to reduce the charging time for the local line LWL, allowing it to be biased across its ends.

Of course, the transistors M1, M2 and M4 should be dimensioned such that their turn-on resistance will not affect the charging transient of the local word line LWL.

The device of these embodiments allows the memory erasing to be effected by applying negative voltages to the gate terminals of the cells, even where the sectors are organized into columns. This is achieved with a reduced space occupation by the decoding circuits compared with a row-based organization.

In addition, this device allows of a hierarchic type of row decoding, affording considerable advantages in terms of space occupation, row decoding design, and parasitic capacitance reduction.

Finally, the charging time for the matrix row can be shortened without resorting to metallization strapping.

Modifications of these embodiments fall within the inventive aspect. For instance, when transistors of a given type have been described, such as N-type or P-type, other types may be substituted without deviating from the spirit of the invention. This invention has broad applications.

What is claimed is:

1. A hierarchic semiconductor memory device of the non-volatile type, comprising
   a matrix of memory cells with sectors organized into columns, wherein each sector has a specific group of local word lines, the matrix further including a main word line running through all of the matrix sectors which have rows in common;
   a first circuit device that includes a first transistor of a first type having first and second conduction terminals connected, respectively, to the main word line and to a first one of the local word lines, and a second transistor of a second type having first and second conduction terminals connected, respectively, to the first local word line and to a reference voltage; and
   a second circuit device that includes a first transistor of the first type having first and second conduction terminals connected, respectively, to the main word line and to a second one of the local word lines, and a second transistor of the second type having first and second conduction terminals connected, respectively, to the second local word line and to the reference voltage, wherein the first circuit device further includes:
      a first additional transistor of the second type having first and second conduction terminals connected, respectively, to the main word line and the first local word line; and
      a charge transistor having first and second conduction terminals connected between the main word line and the first local word line and structured to reduce the charging time for the first local word line, the charge transistor including a control terminal coupled to a control terminal of the first transistor of the first circuit device.

2. The hierarchic semiconductor memory device according to claim 1 wherein said second transistor of said first circuit device and said first additional transistor are triple-well transistors.

3. The hierarchic semiconductor memory device according to claim 1 wherein said second and first additional transistors of the first circuit device have respective body terminals which are applied a negative voltage signal during the phase of erasing the contents of the memory cells.

4. The hierarchic semiconductor memory device according to claim 1 wherein the main word line is a first main word line, the first local word line is coupled to control terminals of memory cells of a first row of a first one of the sectors, and the matrix further includes a second main word line and a third local word line coupled to control terminals of memory cells of a second row of the first sector, the memory device further including a third circuit device that includes a first transistor coupled between the second main word line and the third local word line, a second transistor coupled between the third local word line and the reference voltage, and a second additional transistor coupled between the second main word line and the third local word line, wherein gate terminals of the first and second additional transistors are connected together and receive a same voltage signal.

5. The hierarchic semiconductor memory device according to claim 1 wherein the main word line is a first main word line, the first local word line is coupled to control terminals of memory cells of a first row of a first one of the sectors, and the matrix further includes a second main word line and a third local word line coupled to control terminals of memory cells of a second row of the first sector, the memory device further including a third circuit device that includes a first transistor coupled between the second main word line and the third local word line and a second transistor coupled between the third local word line and the reference voltage, and wherein gate terminals of the second transistors of the first and third circuit devices are connected together and receive a same voltage signal.

6. The hierarchic semiconductor memory device according to claim 1, wherein said charge transistor is a P-channel transistor.

7. The hierarchic semiconductor memory device according to claim 1 wherein the first type of transistor is PMOS.

8. The hierarchic semiconductor memory device according to claim 1 wherein the second type of transistor is NMOS.

9. A non-volatile semiconductor memory comprising:
   a matrix of memory cells having sectors organized into rows and columns, each of the memory cells including a control terminal;
   a main word line coupled to memory cells of the matrix;
   a first local word line coupled to the control terminals of the memory cells of a first row of a first one of the sectors;
   a first circuit device structured to enable a hierarchic form of row decoding, the first circuit device including a first transistor of a first type coupled between the main word line and the first local word line, a second transistor of a second type coupled between the first local word line and a reference voltage, and an additional transistor of the second type coupled between the main word line and the local word line; and
   a charge transistor having first and second conduction terminals connected between the main word line and the first local word line and structured to reduce the charging time for the first local word line, the charge transistor including a control terminal coupled to a control terminal of the first transistor of the first circuit device.

10. The non-volatile semiconductor memory of claim 9, further comprising:
    a second local word line coupled to the control terminals of the memory cells of a first row of a second one of the sectors; and a second circuit device that includes a first transistor coupled between the main word line and the second local word line and a second transistor coupled between the second local word line and the reference voltage.

11. The non-volatile semiconductor memory of claim 10 wherein the second and the first additional transistors of the first circuit device are triple-well transistors.

12. The non-volatile semiconductor memory of claim 10 wherein the second and first additional transistors of the first circuit device each have respective body terminals, and wherein a negative voltage signal is applied to the body terminals during a phase of erasing contents of the memory cells.

13. The non-volatile semiconductor memory of claim 10 wherein the main word line is a first main word line, and the memory further includes a second main word line; a third local word line coupled to control terminals of memory cells of a second row of the first sector; and a third circuit device that includes a first transistor coupled between the second main word line and the third local word line, a second transistor coupled between the third local word line and the reference voltage, and a second additional transistor coupled between the second main word line and the third local word line, and wherein gate terminals of the first and second additional transistors are connected together and receive the same voltage signal.

14. The non-volatile semiconductor memory of claim 9 wherein the main word line is a first main word line, the first local word line is coupled to control terminals of memory cells of a first row of a first one of the sectors, and the memory further includes a second main word line; a third local word line coupled to control terminals of memory cells of a second row of the first sector; and a third circuit device that includes a first transistor coupled between the second main word line and the third local word line and a second transistor coupled between the third local word line and the reference voltage, and wherein gate terminals of the second transistors of the first and third circuit devices are connected together and receive the same voltage signal.

15. The non-volatile semiconductor memory of claim 9 wherein the charge transistor is a P-channel transistor.

16. The non-volatile semiconductor memory of claim 9 wherein the first type of transistor is PMOS.

17. The non-volatile semiconductor memory of claim 9 wherein the second type of transistor is NMOS.

18. A non-volatile semiconductor memory comprising:
a matrix of memory cells having sectors organized into rows and columns, each of the memory cells including a control terminal;
a main word line coupled to memory cells of a plurality of the sectors;
a first local word line coupled to the control terminals of the memory cells of a first row of a first one of the sectors;
a second local word line coupled to the control terminals of the memory cells of a first row of a second one of the sectors;
a first circuit device structured to enable a hierarchic form of row decoding, the first circuit device including first, second, and third transistors coupled between the main word line and the first local word line, the first and second transistors being of a first conductivity type and a third transistor being of a second conductivity type, opposite to the first conductivity type, the first and second transistors having control terminals coupled to each other and to a first select signal and the third transistor having a control terminal coupled to a second select signal complementary to the first select signal; and
a second circuit device structured to enable the hierarchic form of row decoding, the second circuit device including first, second, and third transistors coupled between the main word line and the second local word line, the first and second transistors of the second circuit device being of the first conductivity type and the third transistor of the second circuit device being of the second conductivity type, the first and second transistors of the second circuit device having control terminals coupled to each other and to a third select signal and the third transistor of the second circuit device having a control terminal coupled to a fourth select signal complementary to the third select signal.

19. The non-volatile semiconductor memory of claim 18 wherein the first circuit device further includes a fourth transistor coupled between the first local word line and a reference voltage and the second circuit device further includes a fourth transistor coupled between the second local word line and the reference voltage.

* * * * *